(12) United States Patent
Matsui

(10) Patent No.: US 8,482,000 B2
(45) Date of Patent: Jul. 9, 2013

(54) MOLECULAR ELEMENT, MANUFACTURING METHOD THEREOF, INTEGRATED CIRCUIT DEVICE, MANUFACTURING METHOD THEREOF, THREE-DIMENSIONAL INTEGRATED CIRCUIT DEVICE, AND MANUFACTURING METHOD THEREOF

(75) Inventor: Eriko Matsui, Tokyo (JP)

(73) Assignee: Sony Corporation, Tokyo (JP)

( * ) Notice: Subject to any disclaimer, the term of this patent is extended or adjusted under 35 U.S.C. 154(b) by 97 days.

(21) Appl. No.: 13/119,674

(22) PCT Filed: Sep. 1, 2009

(86) PCT No.: PCT/JP2009/065250
§ 371 (c)(1),
(2), (4) Date: Mar. 17, 2011

(87) PCT Pub. No.: WO2010/032608
PCT Pub. Date: Mar. 25, 2010

(65) Prior Publication Data
US 2011/0168991 A1    Jul. 14, 2011

(30) Foreign Application Priority Data
Sep. 19, 2008 (JP) ................................. 2008-240288

(51) Int. Cl.
*H01L 27/28* (2006.01)

(52) U.S. Cl.
USPC ..................................... 257/40; 257/E51.006

(58) Field of Classification Search
USPC .................. 438/99; 257/40, E51.006
See application file for complete search history.

(56) References Cited

U.S. PATENT DOCUMENTS

| 6,936,190 | B2* | 8/2005 | Yoshida | 252/511 |
| 7,408,184 | B2* | 8/2008 | Matsui et al. | 257/40 |
| 7,580,239 | B2* | 8/2009 | Vincent et al. | 361/311 |
| 7,679,080 | B2* | 3/2010 | Matsui et al. | 257/40 |
| 2007/0241324 | A1* | 10/2007 | Matsui et al. | 257/40 |
| 2008/0269486 | A1* | 10/2008 | Zhou et al. | 544/250 |
| 2011/0286263 | A1* | 11/2011 | Rosselli et al. | 365/151 |

FOREIGN PATENT DOCUMENTS

| JP | 2003-209305 | 7/2003 |
| JP | 2004-221553 | 8/2004 |
| JP | 2005-268778 | 9/2005 |

(Continued)

OTHER PUBLICATIONS

International Search Report dated Oct. 13, 2009, corresponding to Intl. Appln. No. PCT/JP2009/065250.

(Continued)

*Primary Examiner* — George Fourson, III
(74) *Attorney, Agent, or Firm* — K&L Gates, LLP

(57) ABSTRACT

In one example embodiment, a molecular element is configured by bridging a gap between a source electrode and a drain electrode by a functional molecule. The functional molecule arises from covalent linkage of a side chain composed of a pendant molecule that has dielectric constant anisotropy and/or dipole moments and in which orientation change occurs due to an electric field to a main chain composed of a conjugated molecule in which structural change occurs due to the orientation change of the pendant molecule and an electrical characteristic changes. The molecular element is made to work as a diode, a transistor, or a memory by an electric field applied to the pendant molecule of the functional molecule by gate electrodes.

11 Claims, 14 Drawing Sheets

FOREIGN PATENT DOCUMENTS

| | | |
|---|---|---|
| JP | 2006-108627 | 4/2006 |
| JP | 2006-351623 | 12/2006 |
| WO | 2005/076379 A1 | 8/2005 |
| WO | 2006/001394 A1 | 1/2006 |
| WO | 2008/059797 A1 | 5/2008 |

OTHER PUBLICATIONS

Japanese Patent Office, Notice of reasons for refusal issued in connection with Japanese Patent Application No. 2008-240288, dated Oct. 23, 2012. (3 pages).

* cited by examiner

MOLECULAR ELEMENT, MANUFACTURING METHOD THEREOF, INTEGRATED CIRCUIT DEVICE, MANUFACTURING METHOD THEREOF, THREE-DIMENSIONAL INTEGRATED CIRCUIT DEVICE, AND MANUFACTURING METHOD THEREOF

CROSS REFERENCE TO RELATED APPLICATIONS

The present application is a National Stage of International Application No. PCT/JP2009/065250 filed on Sep. 1, 2009, which claims priority to Japanese Patent Application No. 2008-240288 filed on Sep. 19, 2008, the entire contents of which are being incorporated herein by reference

BACKGROUND

In the silicon-based semiconductor element, a transistor is designed and fabricated as a transistor and a diode is designed and fabricated as a diode in accordance with the specifications. Therefore, for example, a field effect transistor can not be used as a diode. Furthermore, a field effect transistor also does not have memory performance. Because semiconductor elements need to be designed and fabricated in accordance with the specifications as just described, it is difficult to reduce the manufacturing cost.

On the other hand, the present assignee has proposed a functional molecule and a functional molecule element having a gate electrode, a source electrode, and a drain electrode (refer to e.g. Patent Document 1). This functional molecule has a side chain composed of a pendant molecule that has dielectric constant anisotropy and/or dipole moments and in which orientation change occurs due to an electric field. This side chain is covalently linked to a main chain composed of a conjugated molecule in which structural change occurs due to the orientation change of the pendent molecule and an electrical characteristic changes. The source electrode and the drain electrode are connected to one end and the other end, respectively, of this main chain. The gate electrode is to apply an electric field for control to the pendant molecule.

Patent Document 1: Japanese Patent Laid-Open No. 2006-108627.

Patent Document 2: Japanese Patent Laid-Open No. 2006-351623.

Non-Patent Document

Non-Patent Document 1: "Doudensei Koubunshi," compiled by Naoya Ogata, issued by Kodansha Scientific Ltd. (1990).

SUMMARY

This disclosure relates to molecular elements, manufacturing methods thereof, integrated circuit devices, manufacturing methods thereof, three-dimensional integrated circuit devices, and manufacturing methods thereof. More specifically, this invention relates to a molecular element whose function can be switched by electric field control, a manufacturing method thereof, an integrated circuit device using this molecular element, a manufacturing method thereof, a three-dimensional integrated circuit device using this molecular element, and a manufacturing method thereof.

In Patent Document 1, it is described that the above-described functional molecule element can be applied to various electronic device fields such as switch, transistor, memory, and logic circuit. However, details thereof are not necessarily clear.

Thus, a problem to be solved by this disclosure is to provide such a molecular element that one molecular element can be used as a diode, a transistor, or a memory by control of the applied electric field and an element having the necessary functions can be inexpensively obtained, and a manufacturing method thereof.

In other words, a problem to be solved by this disclosure is to provide such a molecular element that the function of one molecular element can be switched by control of the applied electric field and an element having the necessary functions can be inexpensively obtained, and a manufacturing method thereof.

Another problem to be solved by this disclosure is to provide an integrated circuit device using the above-described molecular element, a manufacturing method thereof, a three-dimensional integrated circuit device using the above-described molecular element, and a manufacturing method thereof.

To solve the above-described problems, a first disclosure is
a molecular element having
a functional molecule in which a side chain composed of a pendant molecule that has dielectric constant anisotropy and/or a dipole moment and in which orientation change occurs due to an electric field is covalently linked to a main chain composed of a conjugated molecule in which structural change occurs due to the orientation change of the pendant molecule and an electrical characteristic changes,
a source electrode and a drain electrode that are connected to one end and the other end, respectively, of the main chain of the functional molecule, and
a gate electrode for applying an electric field for control to the pendant molecule, and
working as a diode, a transistor, or a memory by an electric field applied to the pendent molecule.

A second disclosure is
a manufacturing method of a molecular element for the case of manufacturing a molecular element having a functional molecule in which a side chain composed of a pendant molecule that has dielectric constant anisotropy and/or a dipole moment and in which orientation change occurs due to an electric field is covalently linked to a main chain composed of a conjugated molecule in which structural change occurs due to the orientation change of the pendant molecule and an electrical characteristic changes, a source electrode and a drain electrode that are connected to one end and the other end, respectively, of the main chain of the functional molecule, and a gate electrode for applying an electric field for control to the pendant molecule, and working as a diode, a transistor, or a memory by an electric field applied to the pendent molecule. The manufacturing method has
a step of forming the source electrode and the drain electrode over a substrate,
a step of bridging a gap between the source electrode and the drain electrode by the functional molecule in such a manner that the source electrode and the drain electrode are connected to one end and the other end, respectively, of the main chain, and
a step of forming the gate electrode over the substrate.

A third disclosure is
an integrated circuit device having at least one molecular element having a functional molecule in which a side chain composed of a pendant molecule that has dielectric constant anisotropy and/or a dipole moment and in which orientation change occurs due to an electric field is covalently linked to a main chain composed of a conjugated molecule in which structural change occurs due to the orientation change of the pendant molecule and an electrical characteristic changes, a source electrode and a drain electrode that are connected to one end and the other end, respectively, of the main chain of the functional molecule, and a gate electrode for applying an electric field for control to the pendant molecule, and working as a diode, a transistor, or a memory by an electric field applied to the pendent molecule.

A fourth disclosure is a manufacturing method of an integrated circuit device for the case of manufacturing an integrated circuit device having at least one molecular element having a functional molecule in which a side chain composed of a pendant molecule that has dielectric constant anisotropy and/or a dipole moment and in which orientation change occurs due to an electric field is covalently linked to a main chain composed of a conjugated molecule in which structural change occurs due to the orientation change of the pendant molecule and an electrical characteristic changes, a source electrode and a drain electrode that are connected to one end and the other end, respectively, of the main chain of the functional molecule, and a gate electrode for applying an electric field for control to the pendant molecule, and working as a diode, a transistor, or a memory by an electric field applied to the pendent molecule. The manufacturing method has a step of forming the source electrode and the drain electrode over a substrate, a step of bridging a gap between the source electrode and the drain electrode by the functional molecule in such a manner that the source electrode and the drain electrode are connected to one end and the other end, respectively, of the main chain, and a step of forming the gate electrode over the substrate.

A fifth disclosure is a three-dimensional integrated circuit device obtained by disposing a plurality of substrates that are opposed to each other and include at least one substrate having at least one molecular element having a functional molecule in which a side chain composed of a pendant molecule that has dielectric constant anisotropy and/or a dipole moment and in which orientation change occurs due to an electric field is covalently linked to a main chain composed of a conjugated molecule in which structural change occurs due to the orientation change of the pendant molecule and an electrical characteristic changes, a source electrode and a drain electrode that are connected to one end and the other end, respectively, of the main chain of the functional molecule, and a gate electrode for applying an electric field for control to the pendant molecule, and working as a diode, a transistor, or a memory by an electric field applied to the pendent molecule.

A sixth disclosure is a manufacturing method of a three-dimensional integrated circuit device for the case of manufacturing a three-dimensional integrated circuit device obtained by disposing a plurality of substrates that are opposed to each other and include at least one substrate having at least one molecular element having a functional molecule in which a side chain composed of a pendant molecule that has dielectric constant anisotropy and/or a dipole moment and in which orientation change occurs due to an electric field is covalently linked to a main chain composed of a conjugated molecule in which structural change occurs due to the orientation change of the pendant molecule and an electrical characteristic changes, a source electrode and a drain electrode that are connected to one end and the other end, respectively, of the main chain of the functional molecule, and a gate electrode for applying an electric field for control to the pendant molecule, and working as a diode, a transistor, or a memory by an electric field applied to the pendent molecule. The manufacturing method has step of forming the source electrode and the drain electrode over the at least one substrate, a step of bridging a gap between the source electrode and the drain electrode by the functional molecule in such a manner that the source electrode and the drain electrode are connected to one end and the other end, respectively, of the main chain, and a step of forming the gate electrode over the at least one substrate.

In this disclosure configured as described above, by only properly selecting the electric field applied to the pendant molecule of the functional molecule by the gate electrode, the molecular element can be made to work as a diode, a transistor, or a memory. Therefore, the molecular element does not need to be designed and fabricated in accordance with the specifications.

According to this disclosure, one molecular element can be used as a diode, a transistor, or a memory by control of the applied electric field. In other words, such a molecular element that the function can be switched and an element having the necessary functions can be inexpensively obtained can be realized. Furthermore, high-performance integrated circuit device and three-dimensional integrated circuit device can be inexpensively realized by using this molecular element.

Additional features and advantages are described herein, and will be apparent from, the following Detailed. Description and the figures.

DETAILED DESCRIPTION

The description will be made in the following order.
1. First Example Embodiment (molecular element and manufacturing method thereof)
2. Second Example Embodiment (molecular element and manufacturing method thereof)
3. Third Example Embodiment (integrated circuit device and manufacturing method thereof)
4. Fourth Example Embodiment (three-dimensional integrated circuit device and manufacturing method thereof)
5. Fifth Example Embodiment (three-dimensional integrated circuit device and manufacturing method thereof)
6. Sixth Example Embodiment (three-dimensional integrated circuit device and manufacturing method thereof)<

<1. First Example Embodiment>
[Molecular Element]

Figure 1A:
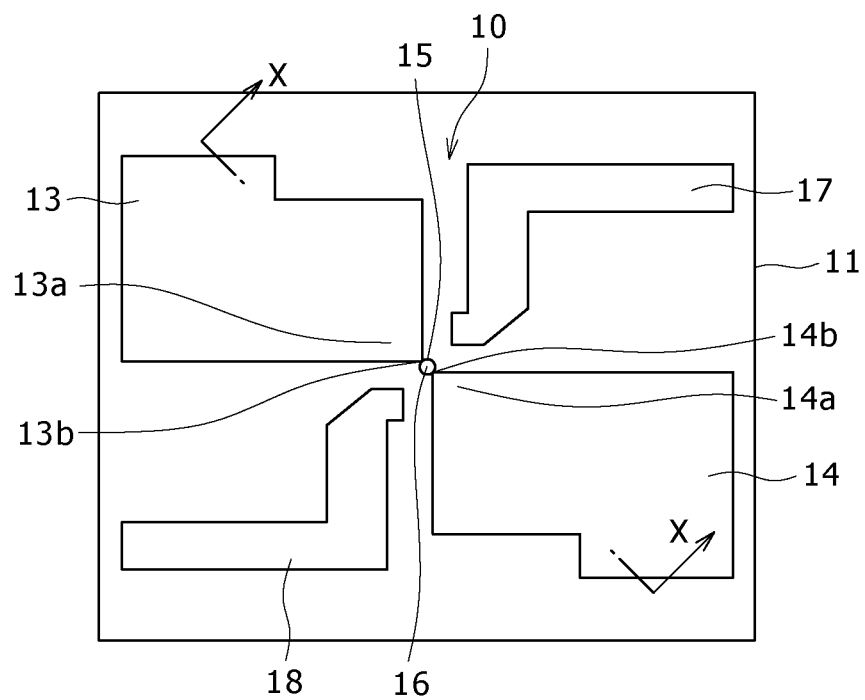
FIG. 1 is a plan view and a sectional view showing a molecular element according to a first example embodiment of this disclosure.
Figure 1B:
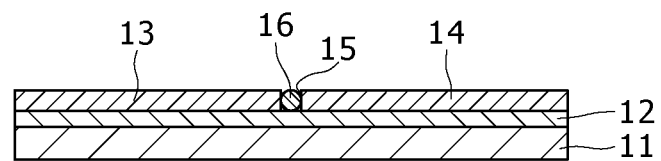

FIG. 1 shows one example of the configuration of a molecular element according to a first embodiment. Here, FIG. 1(A) is a plan view and FIG. 1(B) is an enlarged sectional view along line X-X in FIG. 1(A).

As shown in FIG. 1(A) and FIG. 1(B), in this molecular element 10, a source electrode 13 and a drain electrode 14 are provided on an insulating film 12 formed on a semiconductor substrate 11. The semiconductor substrate 11 is e.g. a Si substrate, a GaAs substrate, or the like. The insulating film 12 is e.g. a $SiO_2$ film or the like having a thickness of about 100 nm.

The source electrode 13 and the drain electrode 14 have corner parts 13a and 14a, respectively. Vertices 13b and 14b of these corner parts 13a and 14a sandwich a gap 15 and are opposed to each other. The gap 15 between these vertices 13b and 14b is bridged by a functional molecule 16. The functional molecule 16 will be described in detail later. These source electrode 13 and drain electrode 14 can be formed from various kinds of conventionally publicly-known metal films (films composed of an elemental metal, films composed of an alloy, etc.), semiconductor films doped with an impurity, etc.

The distance between the vertices 13b and 14b of the source electrode 13 and the drain electrode 14, in other words, the distance of the gap 15, is arbitrarily decided depending on the length of the functional molecule 16. The distance is generally equal to or shorter than 20 nm and typically equal to or shorter than 10 nm.

In the insulating film 12, a pair of gate electrodes 17 and 18 are further provided opposed to each other in such a manner as to sandwich, from both sides, the functional molecule 16 connected between the vertices 13b and 14b of the source electrode 13 and the drain electrode 14. An electric field is applied to the functional molecule 16 by voltage (gate voltage) applied between these gate electrodes 17 and 18, to control this functional molecule 16. These gate electrodes 17 and 18 can be formed from various kinds of conventionally publicly-known metal films. In practice, interconnects are connected to the source electrode 13, the drain electrode 14, and the gate electrodes 17 and 18. However, diagrammatic representation and description of them are omitted.

As described in detail later, this molecular element 10 can be used as a diode, a transistor, or a memory, and in addition as a resistor, according to need.

[Manufacturing Method of Molecular Element]

A manufacturing method of the molecular element 10 will be described.

Figure 2A:
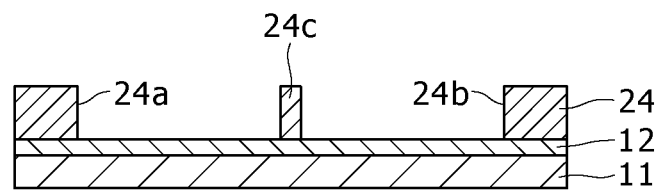
FIG. 2 is a sectional view for explaining a manufacturing method of the molecular element according to the first example embodiment of this disclosure.

First, as shown in FIG. 2(A), a positive resist (e.g. chemically-amplified positive resist for electron beam exposure, OEBR-CAP138 PM, made by TOKYO OHKA KOGYO CO., LTD.) is applied on the insulating film 12 formed on the semiconductor substrate 11, so that a resist film (not shown) is formed.

Figure 3:
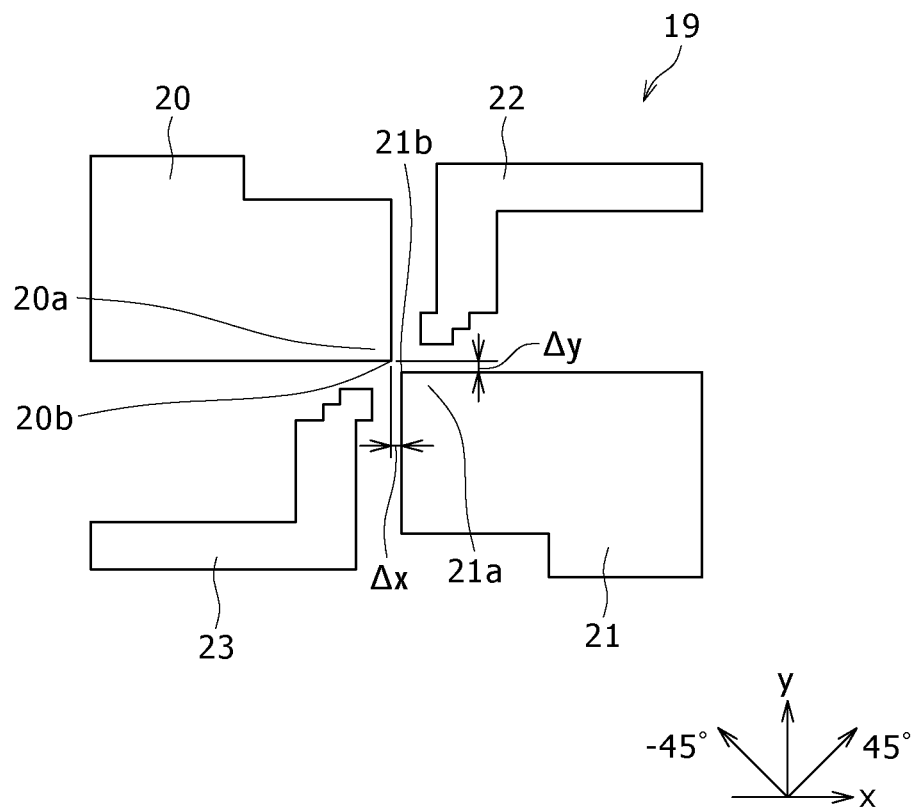
FIG. 3 is a plan view showing a design pattern used when a source electrode, a drain, electrode, and gate electrodes are formed by electron beam exposure in the manufacturing method of the molecular element according to the first example embodiment of this disclosure.

Next, to this resist film, a design pattern 19 for forming the source electrode 13, the drain electrode 14, and the gate electrodes 17 and 18, like that shown in FIG. 3, is transferred by exposure with use of e.g. variable-shaped electron beam exposure apparatus. Specifically, as shown in FIG. 3, a pattern 20 corresponding to the source electrode 13 is first transferred for example. Next, a pattern 21 corresponding to the drain electrode 14 is so transferred that a vertex 21b of a corner part 21a is disposed at a position distant from a vertex 20b of a corner part 20a of the pattern 20 by Δx along the x-axis direction and Δy along the y-axis direction. Δx and Δy are arbitrarily selected. To cite a case, Δx=Δy=30 nm. Next, patterns 22 and 23 corresponding to the gate electrodes 17 and 18 are transferred.

Next, the resist film for which exposure has been performed in the above-described manner is developed. Thereby, as shown in FIG. 2(A), a resist pattern 24 to which the design pattern 19 is transferred as aperture patterns is formed. This resist pattern 24 has aperture patterns with shapes corresponding to the source electrode 13, the drain electrode 14, and the gate electrodes 17 and 18. However, in FIG. 2(A), only aperture patterns 24a and 24b with shapes corresponding to the source electrode 13 and the drain electrode 14 are shown. Of the resist pattern 24, part 24c between these aperture patterns 24a and 24b is part to become the gap 15 finally.

In the above-described manner, transferring is so performed by electron beam exposure that the pattern 20 corresponding to the source electrode 13 and the pattern 21 corresponding to the drain electrode 14 are disposed in such a state that their vertices 20b and 21b are opposed to each other. Therefore, compared with the case of transferring the design pattern disposed in such a state that sides are made to be opposed, the proximity effect attributed to electron scattering can be suppressed in the vicinity of the vertices 20b and 21b of the patterns 20 and 21. As a result, of the resist pattern 24, the part 24c between the aperture patterns 24a and 24b, which will become the gap 15 finally, can be formed with a minute width.

Figure 2B:
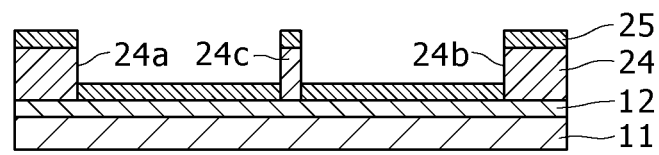

Next, as shown in FIG. 2(B), an electrode film 25 is formed over the semiconductor substrate 11 and on the resist pattern 24 by e.g. a vacuum evaporation method. The material of the electrode film 25 is arbitrarily selected from conventionally publicly-known electrically-conductive materials. For example, a multilayer film obtained by sequentially stacking a chromium (Cr) film having a thickness of 5 nm and a gold (Au) film having a thickness of 20 nm, a polycrystalline Si film doped with an impurity and having a thickness of e.g. about 50 nm, etc. is used.

Figure 2C:
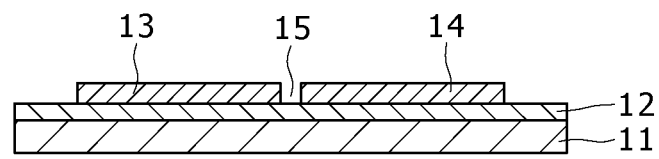

Next, by a lift-off method, the resist pattern 24 is removed together with the electrode film 25 formed thereon. Thereby, as shown in FIG. 2(C), the source electrode 13, the drain electrode 14, and the gate electrodes 17 and 18 are formed at the parts where the aperture patterns 24a and 24b existed and the parts where the aperture patterns with the shapes corresponding to the gate electrodes 17 and 18 existed, respectively. In this case, the distance of the gap 15 between the source electrode 13 and the drain electrode 14 can be set equal to or shorter than 20 nm for example.

Figure 2D:
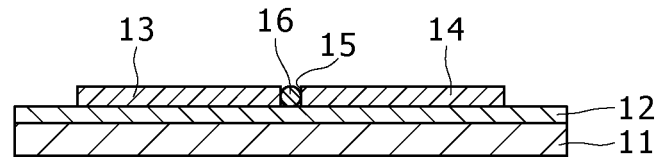

Next, as shown in FIG. 2(D), the gap 15 between the source electrode 13 and the drain electrode 14 is bridged by the functional molecule 16. To bridge the gap 15 by the functional molecule 16, for example, a solution containing this functional molecule 16 is dropped or applied onto an area including at least the gap 15 over the semiconductor substrate 11, or the semiconductor substrate 11 is immersed in the solution containing the functional molecule 16. By doing so, the functional molecule 16 in this solution enters the gap 15 and is connected between the source electrode 13 and the drain electrode 14 by self-assembly, After the solution containing the functional molecule 16 is dropped or applied over the semiconductor substrate 11 or the semiconductor substrate 11 is immersed in this solution, the excess functional molecules 16 left on the surface of the semiconductor substrate 11 are removed by cleaning.

Concretely, for example if a substance obtained by coupling a thiol group (—SH) to one end and the other end of an oligofluorene main chain of a π-conjugated molecule with a structural liquid crystal side chain, shown in FIG. 7 to be described later, is used as the functional molecule 16, e.g. the following way is employed. Specifically, 1 μL of a 1-mmol/L tetrahydrofuran (THF) solution of this molecule is dropped onto an area including the gap 15, the source electrode 13, and the drain electrode 14, and is kept stationary under the THF-saturated vapor pressure for 24 hours. Thereafter, the excess molecules are removed by cleaning with THF.

Figure 4:
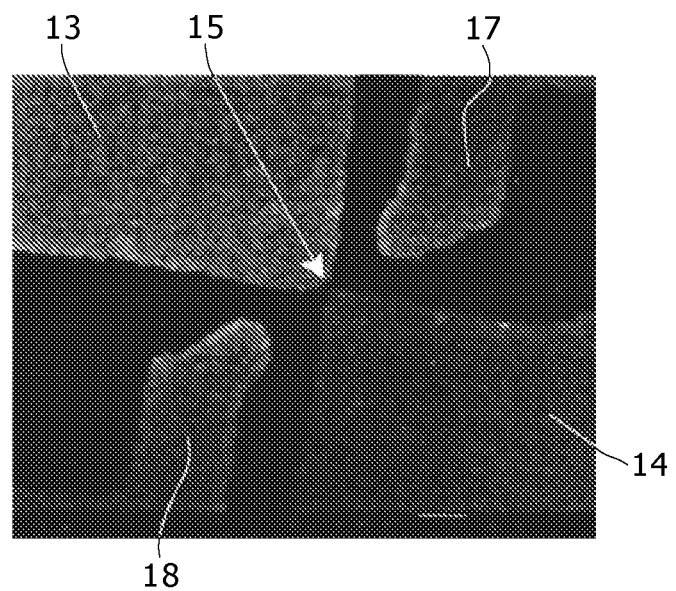
FIG. 4 is a diagram-substitute picture showing the result of forming of the source electrode, the drain electrode, and the gate electrodes by electron beam exposure with use of the design pattern shown in FIG. 3.

By the above-described process, the intended molecular element 10 of the field effect type is manufactured. A scanning electron microscope (SEM) picture of the source electrode 13, the drain electrode 14, and the gate electrodes 17 and 18 actually fabricated by the above-described method is shown in FIG. 4. From FIG. 4, it turns out that the distance of the gap 15 between the source electrode 13 and the drain electrode 14 is 11.8 nm, i.e. extremely short.

Figure 5:
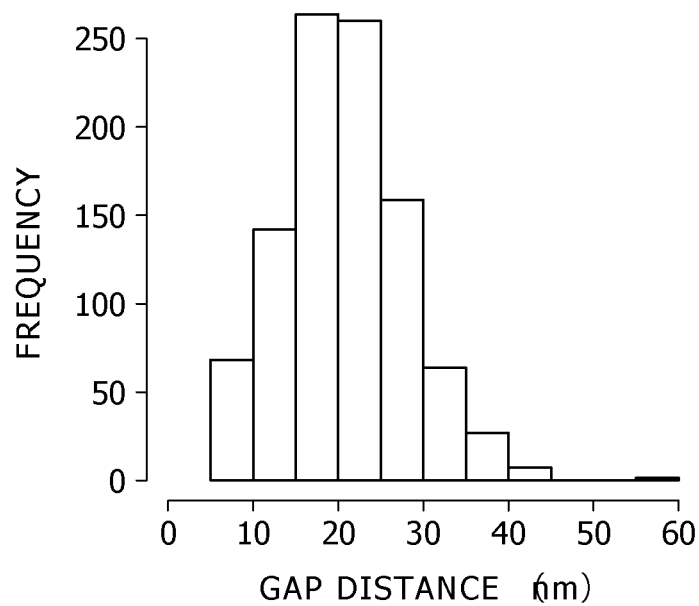
FIG. 5 is a schematic diagram showing the frequency distribution of the distance of the gap between the source electrode and the drain electrode when the source electrode, the drain electrode, and the gate electrodes are formed by electron beam exposure with use of the design pattern shown in FIG. 3.

FIG. 5 shows a frequency distribution graph of the result of measurement of the distances of the gaps 15 finally obtained by transferring the above-described design patterns 19 to the entire surface of the semiconductor substrate 11 (semiconductor wafer) having a diameter of 200 mm by electron beam exposure. As shown in FIG. 5, it was confirmed that a sufficient number of electrode patterns were obtained with a peak around 20 nm=the distance of the gap 15. The percentage of distances equal to or shorter than 20 nm, of the obtained gaps 15, was about 30%.

As described above, by transferring the design pattern 19 shown in FIG. 3 to a resist film by electron beam exposure, the source electrode 13 and the drain electrode 14 having e.g. the gap 15 whose distance is equal to or shorter than 20 nm can be formed with a high yield.

By the above-described process, the intended molecular element 10 of the field effect type is manufactured.

[Description of Operation]

The functional molecule 16 arises from covalent linkage of a side chain composed of a pendant molecule to a main chain composed of a conjugated molecule in which structural change (change in the conformation) occurs due to orientation change of this pendant molecule and an electrical characteristic changes. This pendant molecule has dielectric constant anisotropy and/or dipole moments, and orientation change thereof occurs due to an electric field.

Figure 6A:
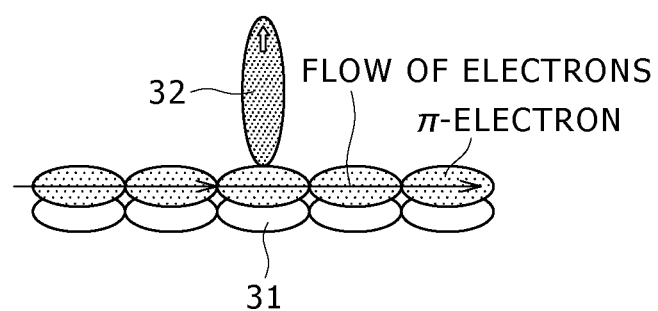
FIG. 6 is a schematic diagram showing one example of a functional molecule formed in the gap between the source electrode and the drain electrode in the molecular element according to the first example embodiment of this disclosure.

This functional molecule 16 is schematically shown in FIG. 6. As shown in FIGS. 6(A) and (B), this functional molecule 16 has a main chain 31 and a side chain 32 in the form of a line or a film, and the side chain 32 is covalently linked to the main chain 31. The main chain 31 has a conjugated system and exhibits electrical conductivity due to delocalized electrons. The side chain 32 has plural dipole moments and/or dielectric constant anisotropy, and the side chain 32 composed of a pendant molecule in which orientation change occurs due to an electric field has a tendency to be oriented in a specific direction with respect to the orientation of an electric field in the electric field (specifically, such a parallel direction that the longitudinal-axis direction of the molecule corresponds with the orientation of the electric field or a perpendicular direction) because the side chain 32 has dielectric constant anisotropy and/or dipole moments.

Therefore, the electric field applied to the side chain 32 is changed to thereby change the position of the side chain 32 with respect to the electric field direction, and as the result thereof, the angle formed by the side chain 32 and the main chain 31 is changed. In this manner, the electrical conductivity (ease of electron flowing) of the main chain 31 can be controlled.

In the state shown in FIG. 6(A), the dihedral angle (torsion angle) of the main chain 31 composed of the conjugated molecule is close to that of a flat plane. In this state, electrons in the main chain 31 composed of the conjugated molecule can flow without being interrupted and this functional molecule 16 is in the conductive (on) state.

Figure 6B:
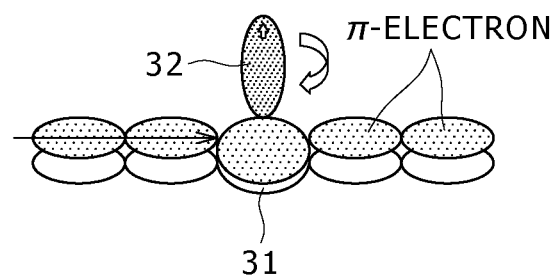

In contrast, in the state shown in FIG. 6(B), because the orientation of the side chain 32 has changed, the dihedral angle of the main chain 31 greatly changes compared with that of a flat plane and the planarity of the main chain 31 is lost. In this state, electrons in the main chain 31 composed of the conjugated molecule are blocked by the torsion of the main chain 31 and can not flow and this functional molecule 16 is in the non-conductive (off) state.

As the conjugated molecule of this functional molecule 16, e.g. the following electrically-conductive oligomers and so forth are cited. However, the conjugated molecule is not limited thereto.

oligofluorene
oligopyridine
porphyrin one-dimensional oligomer
oligophenylenevinylene
oligo(p-phenylene)
oligonaphthalene
oligoanthracene
oligopyrene
oligoazulene
oligofuran
oligothiophene
oligoselenophene
oligo(p-phenylene sulfide)
oligo(p-phenylene oxide)
oligoaniline Among them, a molecule having a fluorene skeleton is preferable as the conjugated molecule. Furthermore, as the pendant molecule, e.g. 4-pentyl-4'-cyanobiphenyl, molecules that have a carbonyl group (C=O), a halogen (—Cl or the like), a =N—H group, a —OH group, a =C=S group, etc. having a dipole moment, and so forth are cited. However, this conjugated molecule is not limited to them. Among them, a molecule having a cyanobiphenyl skeleton is preferable as this pendent molecule.

Figure 7:
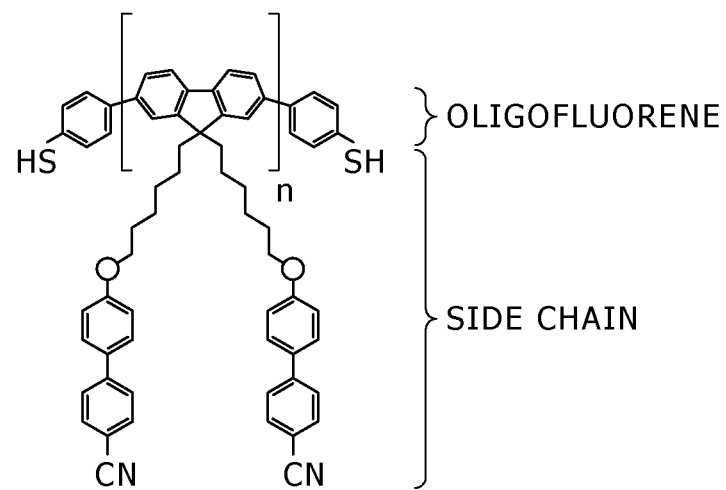
FIG. 7 is a schematic diagram showing a specific example of the functional molecule shown in FIG. 6.

FIG. 7 shows a specific example of the functional molecule 16. This functional molecule 16 is a π-conjugated molecule with a structural liquid crystal side chain and has an oligofluorene main chain and a liquid crystal side chain composed of 4-pentyl-4'-cyanobiphenyl. A thiol group (—SH) is coupled to one end and the other end of the oligofluorene main chain. The length of the oligofluorene main chain of this functional molecule 16 differs depending on the degree of polymerization of the oligofluorene. For example, the length is about 7 to 10 nm if the degree of polymerization is 7 to 10.

Figure 8:
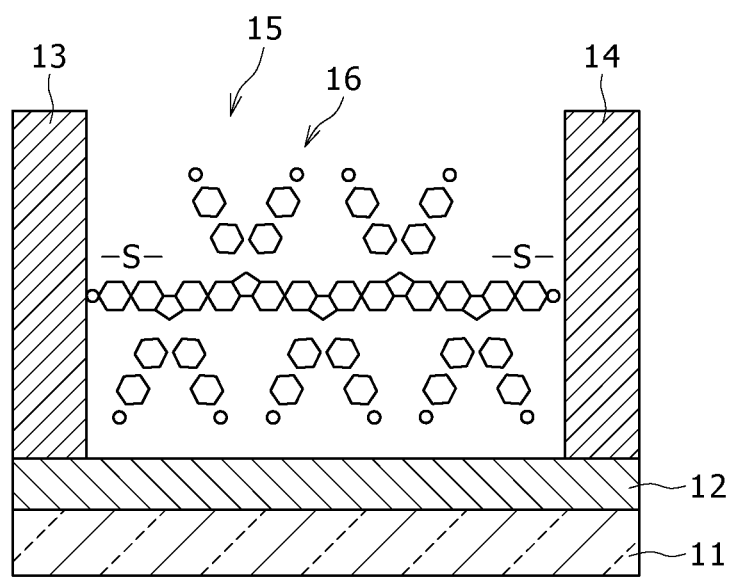
FIG. 8 is a sectional view showing the state in which the functional molecule shown in FIG. 7 is formed in the gap between the source electrode and the drain electrode in the molecular element according to the first example embodiment of this disclosure.

FIG. 8 schematically shows the state in which the gap 15 between the source electrode 13 and the drain electrode 14 is bridged by this π-conjugated molecule with the structural liquid crystal side chain. As shown in FIG. 8, one end and the other end of the oligofluorene main chain of this π-conjugated molecule with the structural liquid crystal side chain are coupled to the tip part of the source electrode 13 and the tip part of the drain electrode 14, respectively, via the thiol group.

Figure 9:
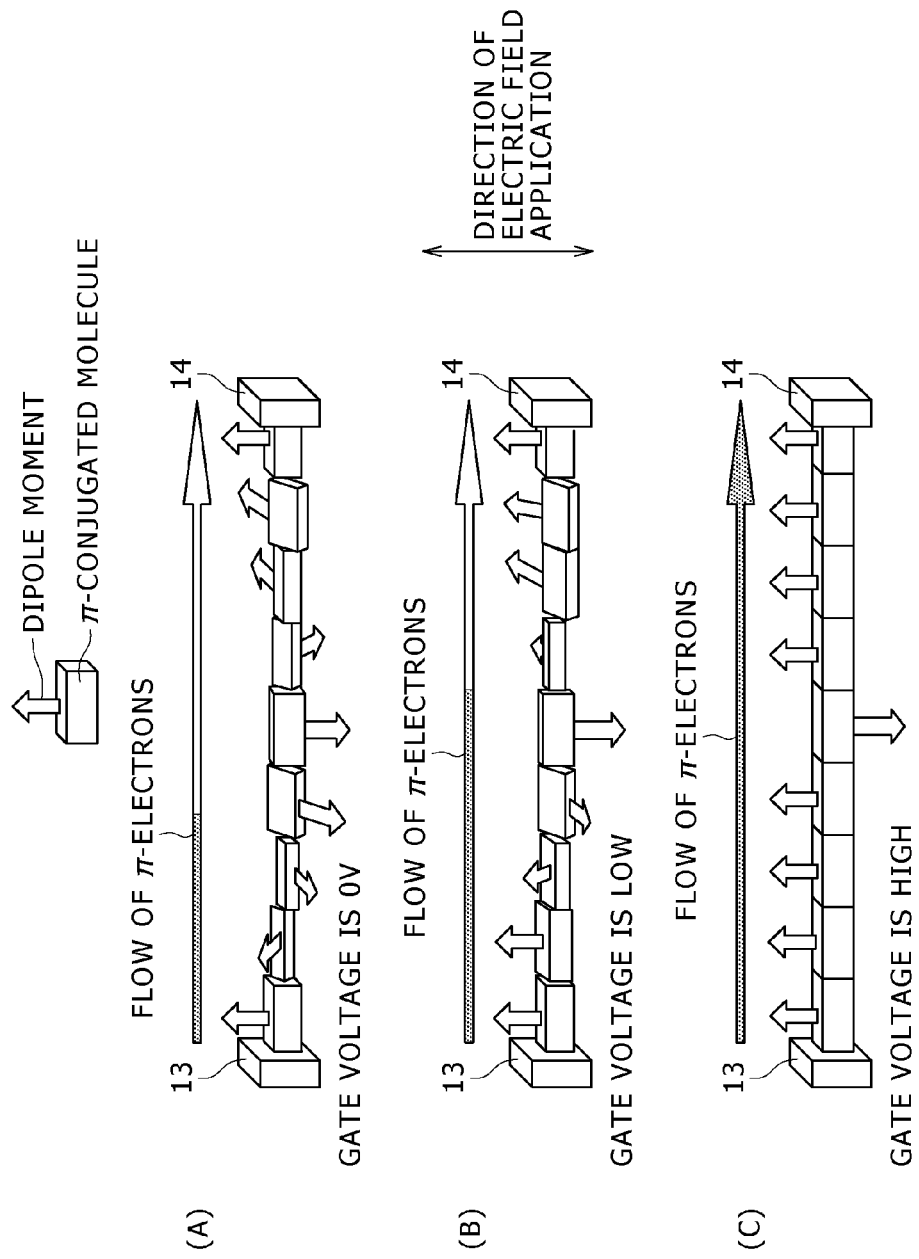
FIG. 9 is a schematic diagram for explaining the mechanism of control of the electrical conductivity of the functional molecule shown in FIG. 7 by electric field application.

The mechanism of the occurrence of modulation of the electrical conductivity due to electric field application in the above-described π-conjugated molecule with the structural liquid crystal side chain will be described based on FIG. 9. As shown in FIG. 9(A) to FIG. 9(C), before electric field application, i.e. when the gate voltage=0 V, the oligofluorene main chain has a gently-twisted helical structure in such a state as to be stabilized due to packing between the side chains.

When an electric field is applied, i.e. when the gate voltage is applied, the stable structure of the whole of the molecule including the oligofluorene main chain changes due to change in the orientation of the side chain, and the dihedral angle of the oligofluorene main chain changes along with increase in the gate voltage. As a result, electrical conductivity develops. It is known that the stable dihedral angle of oligofluorene changes if the side chain is different.

<2. Second Example Embodiment>
[Molecular Element]

Figure 10A:
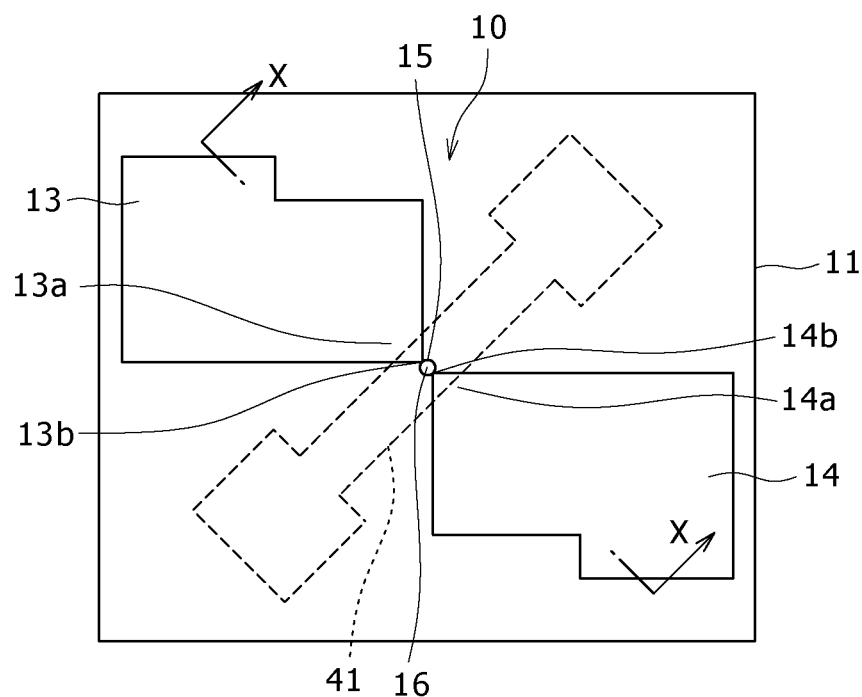
FIG. 10 is a plan view and a sectional view showing a molecular element according to a second example embodiment of this disclosure.
Figure 10B:
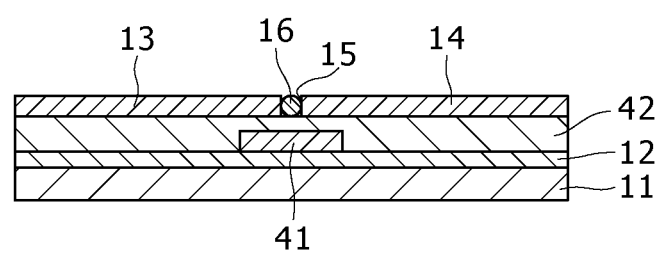

FIG. 10 shows a molecular element according to a second example embodiment. Here, FIG. 10(A) is a plan view and FIG. 10(B) is an enlarged sectional view along line X-X in FIG. 10(A).

As shown in FIG. 10, in this molecular element 10, a gate electrode 41 is provided on the insulating film 12, such as a $SiO_2$ film, formed on the semiconductor substrate 11 and having a thickness of e.g. about 100 nm. An insulating film 42 such as a $SiO_2$ film is so provided as to cover this gate electrode 41.

The source electrode 13 and the drain electrode 14 are provided on this insulating film 42. The functional molecule 16 is provided as a bridge between the vertices 13b and 14b of the corner parts 13a and 14a of these source electrode 13 and drain electrode 14. In this case, an electric field is applied to the functional molecule 16 by voltage (gate voltage) applied to the gate electrode 41, to control this functional molecule 16.

[Manufacturing Method of Molecular Element]

As shown in FIG. 10, first, the gate electrode 41 is formed on the insulating film 12 formed on the semiconductor substrate 11. Next, e.g. the insulating film 42 is so formed as to cover this gate electrode 41. Next, on this insulating film 42, the source electrode 13 and the drain electrode 14 are so formed as to be opposed to each other with the intermediary of the gap 15 by a method similar to that of the first example embodiment. Thereafter, the gap 15 between the source electrode 13 and the drain electrode 14 is bridged by the functional molecule 16 by a method similar to that of the first example embodiment.

By the above-described process, the intended molecular element 10 of the field effect type is manufactured.

Figure 11:
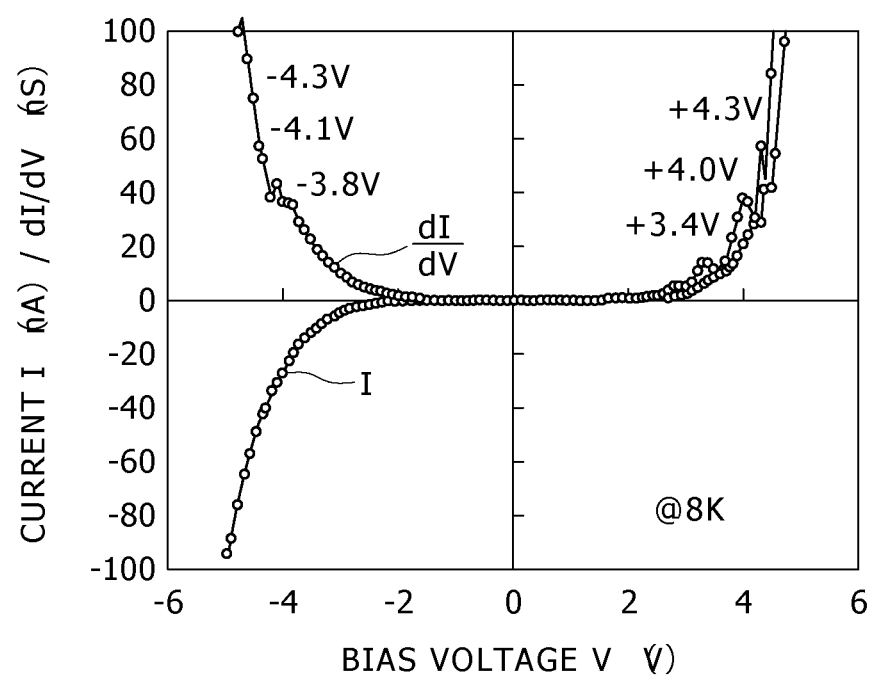
FIG. 11 is a schematic diagram showing the measurement result of the current-voltage characteristic of the molecular element according to the second example embodiment of this disclosure.

FIG. 11 shows the measurement result of the current-voltage characteristic when the gate electrode 41 is grounded and the bias voltage between the source electrode 13 and the drain electrode 14 is changed at 8 K in the molecular element 10 according to the second example embodiment in which the molecule shown in FIG. 7 is used as the functional molecule 16. The distance of the gap 15 between the source electrode 13 and the drain electrode 14 is 7.5 nm, and the source electrode 13 and the drain electrode 14 are formed of a gold film having a thickness of 20 nm. Furthermore, the insulating film 42 is formed of a $SiO_2$ film, and the thickness of the $SiO_2$ film as the insulating film 42 between the gate electrode 41 and the source electrode 13 and the drain electrode 14 is 50 nm. As shown in FIG. 11, steps (given voltage values) due to the molecular orbital of the functional molecule 16 are observed in the current-voltage curve, and thus it is proven that the number of functional molecules 16 is small enough that the quantum effect is seen. In this case, because the source electrode 13 and the drain electrode 14 are formed from gold, the current-voltage curve is almost symmetrical about positive and negative biases. However, this molecular element 10 can be made to work as a diode by using the anterior and posterior zones of the step.

Figure 12:
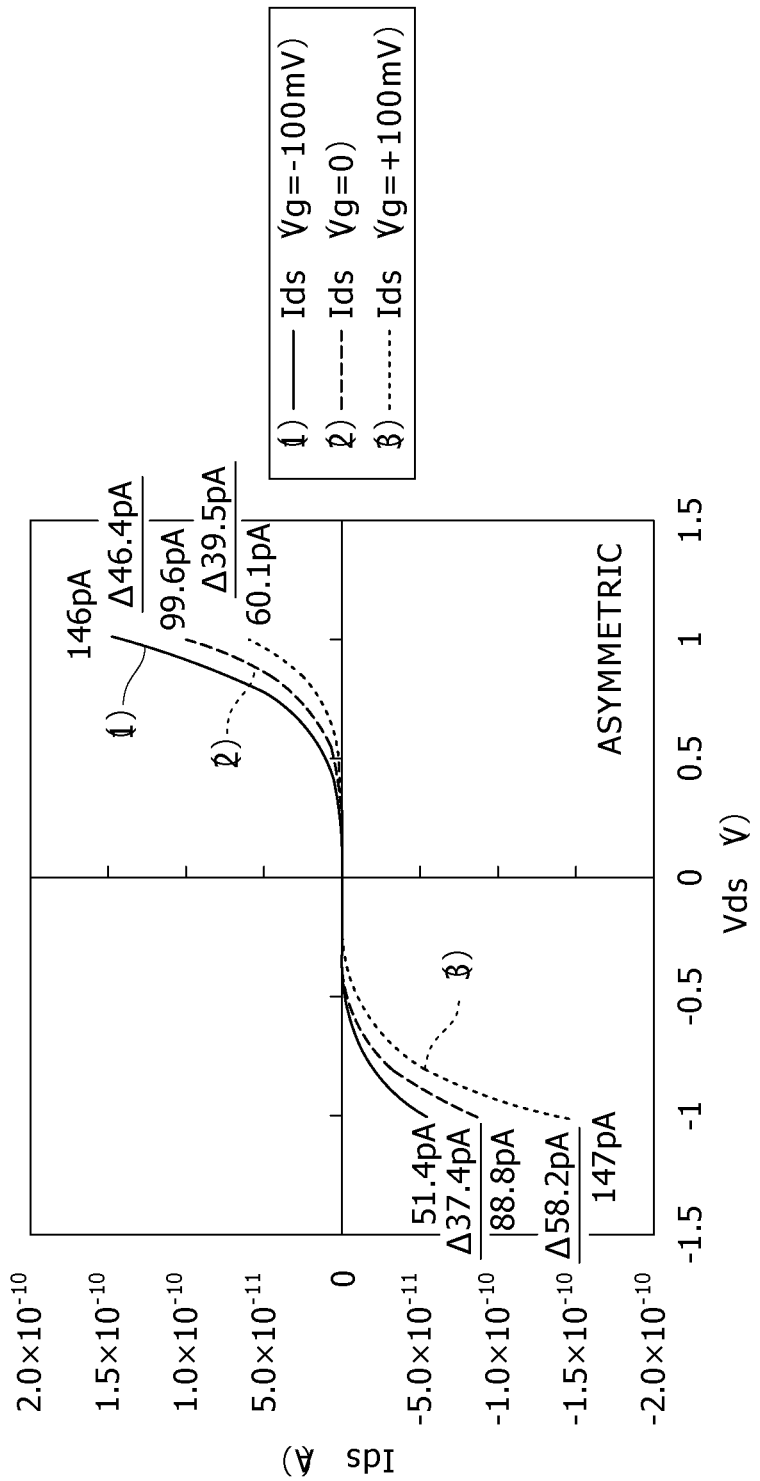
FIG. 12 is a schematic diagram showing the measurement result of the drain current-drain voltage characteristic when the gate voltage is changed in the molecular element according to the second example embodiment of this disclosure.

FIG. 12 shows the measurement result of the drain current ($I_{ds}$)-drain voltage ($V_{ds}$) characteristic when the gate voltage (voltage applied to the gate electrode 41) is changed at 300 K in the molecular element 10 according to the second example embodiment in which the molecule shown in FIG. 7 is used as the functional molecule 16. The gate voltage $V_g$ and the drain voltage $V_{ds}$ are each voltage on the basis of the ground potential. The source electrode 13 was grounded. From FIG. 12, it turns out that this molecular element 10 exhibits opposite diode characteristics depending on the polarity of the gate voltage $V_g$. This molecular element 10 can also be turned on/off by the gate voltage $V_g$. Furthermore, it is also possible to drive the molecular element 10 by a low voltage such as $V_{ds}=1$ V without using the molecular orbital.

If a higher gate voltage $V_g$ is applied in this molecular element 10, the molecular structure of the functional molecule 16 changes. In addition, with this structure, memory performance that will be attributed to a rotational barrier of the dihedral angle of the fluorene unit develops. How the memory performance develops is shown in FIG. 13.

Figure 13:
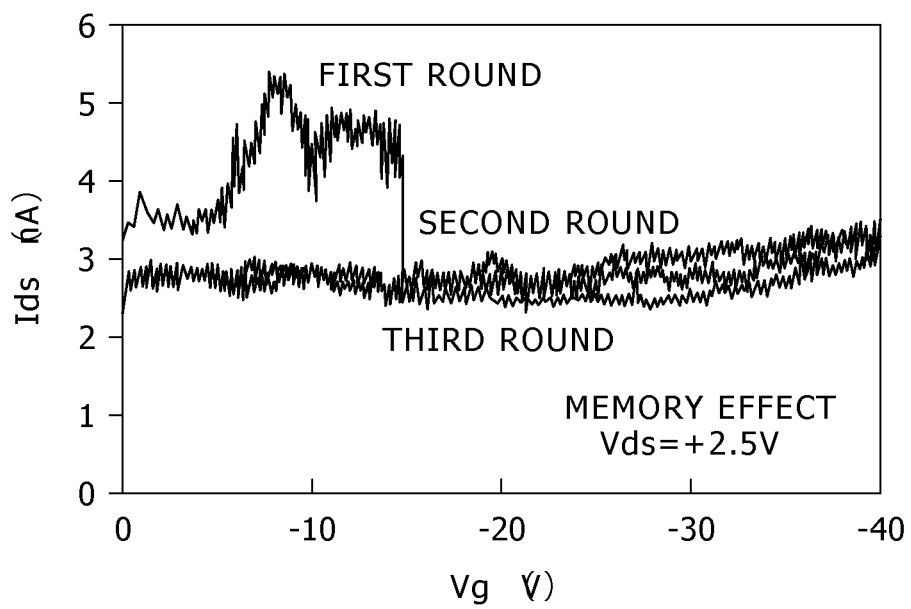
FIG. 13 is a schematic diagram showing the measurement result of the drain current when the gate voltage is changed in the molecular element according to the second example embodiment of this disclosure.

As shown in FIG. 13, when sweeping of the gate voltage $V_g$ from 0 V to −40 V is repeated three times, $I_{ds}$ suddenly decreases at $V_g$=−15 V in the first round of the sweeping (this decrease will be attributed to the occurrence of change in the molecular structure of the functional molecule 16). Since then, $I_{ds}$ is almost constant, and this value of $I_{ds}$ is maintained in the second round and third round of the sweeping.

By utilizing this, this molecular element 10 can be made to work as a memory. Specifically, if e.g. $V_g$=−15 V is employed as the threshold voltage and e.g. data "1" is written to the molecular element 10, the gate voltage $V_g$ lower than this threshold voltage, e.g. 10 V, is applied. Furthermore, in the case of writing data "0", the gate voltage $V_g$ higher than this threshold voltage, e.g. 20 V, is applied.

The above-described measurement results apply also to the molecular element 10 according to the first example embodiment in which the molecule shown in FIG. 7 is used as the functional molecule 16.

As described above, according to the first and second example embodiments, e.g. the extremely-narrow gap 15 whose distance is equal to or shorter than 20 nm or equal to or shorter than 10 nm can be easily formed with high reproducibility between the source electrode 13 and the drain electrode 14. Furthermore, this gap 15 can be easily bridged by the functional molecule 16. Thereby, the molecular element 10 of the field effect type can be obtained at low cost.

Furthermore, this molecular element 10 can be made to work as a diode of two kinds of directions by the gate voltage $V_g$ although it is one element. In addition, it can be made to work also as a field effect transistor and furthermore can be made to work also as a memory. That is, as long as this molecular element 10 is made, its function can be switched by control of the gate voltage $V_g$ and it can be made to work as a diode, a transistor, or a memory. Therefore, the molecular element 10 does not need to be designed and fabricated in accordance with the specifications, and thus logic circuits, memory circuits, etc. can be manufactured at low cost by using this molecular element 10.

<3. Third Example Embodiment>
[Integrated Circuit Device]

Figure 14:
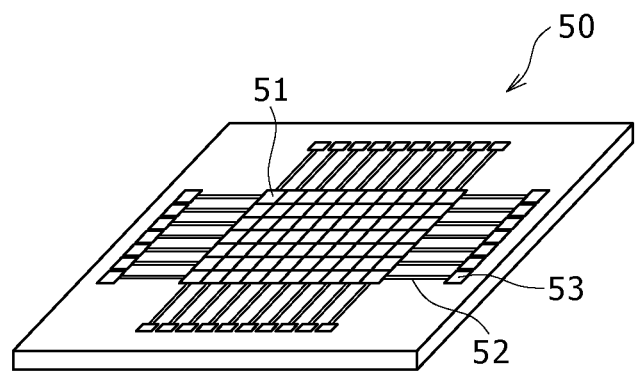
FIG. 14 is a perspective view showing an integrated circuit device according to a third example embodiment of this disclosure.

FIG. 14 shows one example of the configuration of an integrated circuit device (hereinafter, referred to as the IC chip) according to a third example embodiment.

As shown in FIG. 14, an IC chip 50 has a circuit part 51 having the configuration suitable for the functions given to this IC chip 50 and plural pad electrodes 53 connected to this circuit part 51 by interconnects 52. The circuit part 51 includes e.g. a logic circuit, a memory cell array, a sense amplifier, a decoder, etc., and is configured by the molecular elements 10 according to the first or second example embodiment, other various kinds of elements, interconnects for connection among elements, and so forth.

The pad electrodes 53 are provided at the peripheral part of the IC chip 50. The pad electrode 53 is obtained by stacking a gold (Au) film having a thickness of 100 nm on a titanium (Ti) film having a thickness of 5 nm for example and is formed by a vacuum evaporation method or the like. The IC chip 50 is e.g. a device using a semiconductor substrate such as a Si substrate or a GaAs substrate.

Elements other than the molecular element 10 in the circuit part 51, particularly semiconductor elements, can be formed on the semiconductor substrate by a conventionally publicly-known semiconductor technology.

The molecular element 10 included in the circuit part 51 is used as a diode, a transistor, or a memory by application of the gate voltage, depending on the functions given to the circuit part 51. The manufacturing method of these molecular elements 10 is similar to that of the first or second example embodiment.

[Manufacturing Method of Integrated Circuit Device]

The circuit part 51, the interconnects 52, the pad electrodes 53, and so forth are formed on the semiconductor substrate 11 by using a conventionally publicly-known semiconductor technology. At this timing, the functional molecule 16 has not yet been formed in the gap 15 between the source electrode 13 and the drain electrode 14 of the molecular element 10 included in the circuit part 51. Next, the gap 15 between the source electrode 13 and the drain electrode 14 is bridged by the functional molecule 16 by a method similar to that of the first example embodiment.

Next, the semiconductor substrate 11 is turned to chips. In this manner, the IC chip 50 is manufactured.

According to this third example embodiment, the molecular element 10 included in the circuit part 51 can be made to work as a diode, a transistor, or a memory by application of the gate voltage, depending on the functions given to the circuit part 51. Thus, the circuit part 51 can be inexpensively configured. Consequently, the manufacturing cost of the IC chip 50 can be reduced.

<4. Fourth Example Embodiment>
[Example of Three-dimensional Integrated Circuit Device]

Figure 15:
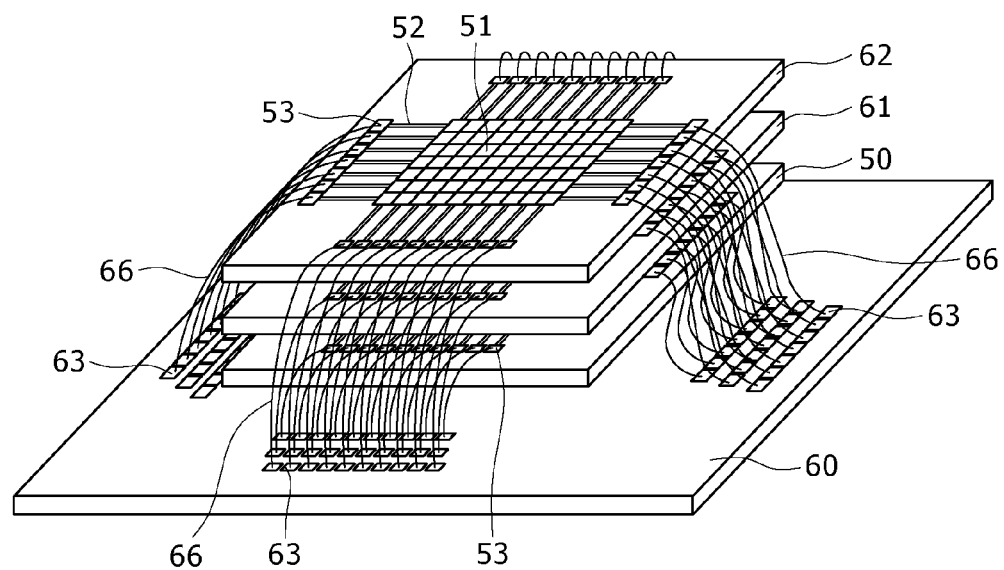
FIG. 15 is a perspective view showing a three-dimensional integrated circuit device according to a fourth example embodiment of this disclosure.

FIG. 15 explains a three-dimensional integrated circuit device (hereinafter, referred to as the three-dimensional IC) according to a fourth example embodiment.

As shown in FIG. 15, in this three-dimensional IC, the IC chip 50 shown in FIG. 14 and one or plural IC chips similar to this IC chip 50 are sequentially stacked over a mounting substrate 60. The gap 15 between the source electrode 13 and the drain electrode 14 of the molecular element 10 included in the circuit part 51 of the IC chip 50 is bridged by the functional molecule 16. The same also applies to one or plural IC chips similar to this IC chip 50.

The number of IC chips stacked over the mounting substrate 60 is not particularly limited. Here, the case in which three IC chips 50, 61, and 62 are stacked will be described as one example. These IC chips 50, 61, and 62 may be ones having the same configuration or may be ones different from each other.

At the peripheral part of the mounting substrate 60, pad electrodes 63 for connection to the pad electrodes 53 of the IC chips 50, 61, and 62 stacked over this mounting substrate 60 are provided.

Figure 16:
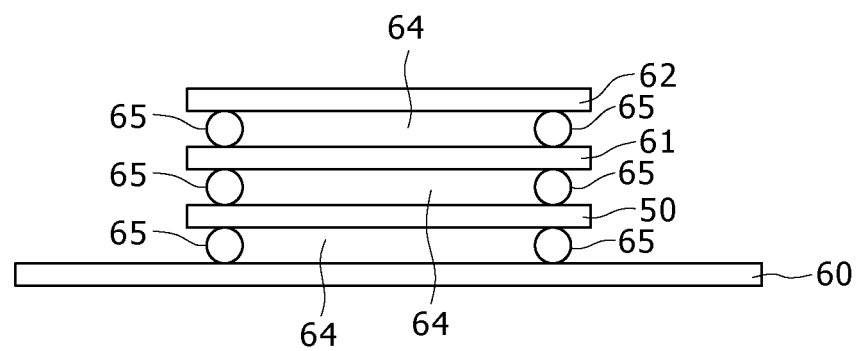
FIG. 16 is a sectional view of FIG. 15.

As shown in FIG. 16, a gap 64 of a predetermined distance is set between the mounting substrate 60 and the IC chip 50, between the IC chip 50 and the IC chip 61, and between the IC chip 61 and the IC chip 62. For this purpose, spacers 65 having a predetermined thickness are each provided between the mounting substrate 60 and the IC chip 50, between the IC chip 50 and the IC chip 61, and between the IC chip 61 and the IC chip 62. As this spacer 65, e.g. a glass bead is used. However, the spacer 65 is not limited thereto. Although the distance of the gap 64 is arbitrarily selected, such a size that a solution containing the functional molecule 16 can be injected into this gap 64 by capillary action as described later is selected. Specifically, e.g. about 30 μm is selected.

Bonding is made by wires 66 between the pad electrodes 63 of the mounting substrate 60 and the pad electrodes 53 of the IC chips 50, 61, and 62.

[Manufacturing Method of Three-dimensional Integrated Circuit Device]

A manufacturing method of this three-dimensional IC will be described.

Figure 17:
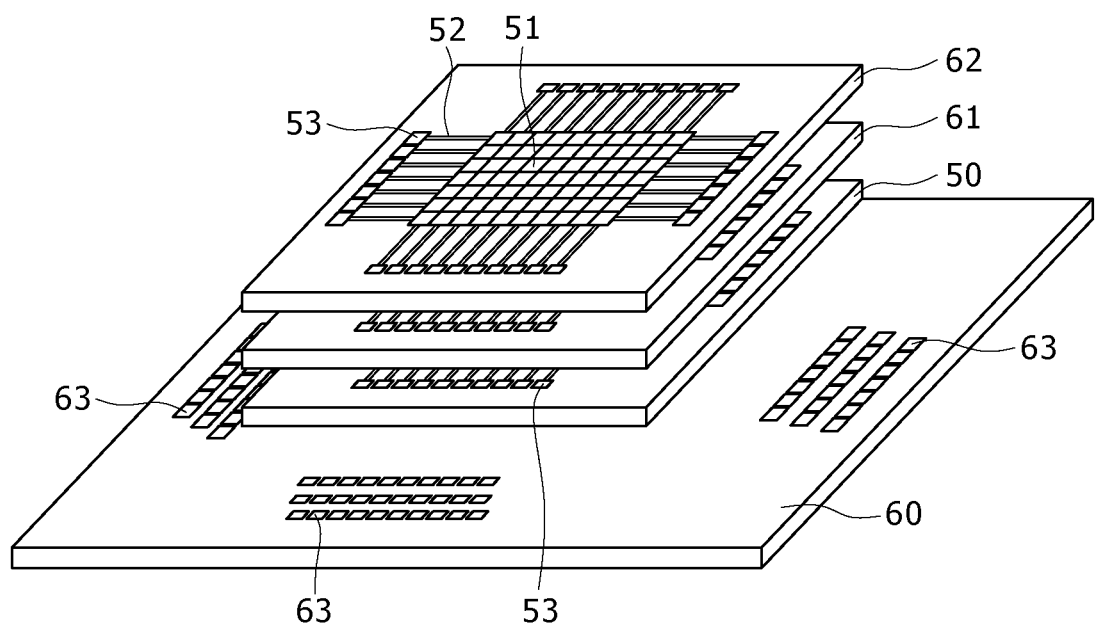
FIG. 17 is a perspective view for explaining a manufacturing method of the three-dimensional integrated circuit device according to the fourth example embodiment of this disclosure.

As shown in FIG. 17, the IC chip 50, the IC chip 61, and the IC chip 62 are sequentially stacked over the mounting substrate 60, with the spacers 65 sandwiched between the IC chips. At this timing, the functional molecule 16 is not connected to the gap 15 between the source electrode 13 and the drain electrode 14 of the molecular element 10 included in the circuit part 51 of the IC chip 50.

Next, bonding is made by the wires 66 between the pad electrodes 63 of the mounting substrate 60 and the pad electrodes 53 of the IC chips 50, 61, and 62.

Next, the component obtained by stacking the IC chips 50, 61, and 62 over the mounting substrate 60 and making the bonding by the wires 66 in this manner is immersed in a solution containing the functional molecule 16. Furthermore, this solution is injected into each of the gaps 64 among the mounting substrate 60 and the IC chips 50, 61, and 62 by capillary action. The temperature in the injection of this solution can be arbitrarily selected. For example, the injection is performed at a room temperature. When the solution is thus injected into the gap 64, the gap 15 between the source electrode 13 and the drain electrode 14 is bridged by the functional molecule 16 in this solution by self-assembly similarly to the first example embodiment. Thereafter, the component obtained by stacking the IC chips 50, 61, and 62 over the mounting substrate 60 is taken out from the solution to the air. In this manner, the molecular element 10 of the field effect type in which the functional molecule 16 is connected between the source electrode 13 and the drain electrode 14 is completed and hence the IC chips 50, 61, and 62 are completed.

By the above-described process, the intended three-dimensional IC is manufactured.

As described above, according to this fourth example embodiment, a circuit is turned to a three-dimensional one by stacking, over the mounting substrate 60, the IC chips 50, 61, and 62 in which the functional molecule 16 is not formed between the source electrode 13 and the drain electrode 14 of the molecular element 10. Furthermore, thereafter, a solution containing the functional molecule 16 is injected into the gaps 64 among the IC chips 50, 61, and 62 by capillary action, and the gap 64 between the source electrode 13 and the drain electrode 14 is bridged by the functional molecule 16 in this solution by self-assembly. Therefore, a high-temperature process or the like does not need to be carried out after the completion of the molecular element 10, and the deterioration of the functional molecule 16 can be prevented. Consequently, the deterioration of the performance of the molecular element 10 can be prevented.

Furthermore, by only injecting the solution containing the functional molecule 16 into the gaps 64 among the IC chips 50, 61, and 62 by capillary action, the gap 15 between the source electrode 13 and the drain electrode 14 can be bridged by the functional molecule 16. Thus, the manufacturing steps can be simplified compared with conventional three-dimensional ICs, and hence the manufacturing cost can be reduced.

<5. Fifth Example Embodiment>
[Three-Dimensional Integrated Circuit Device and Manufacturing Method Thereof]

Figure 18:
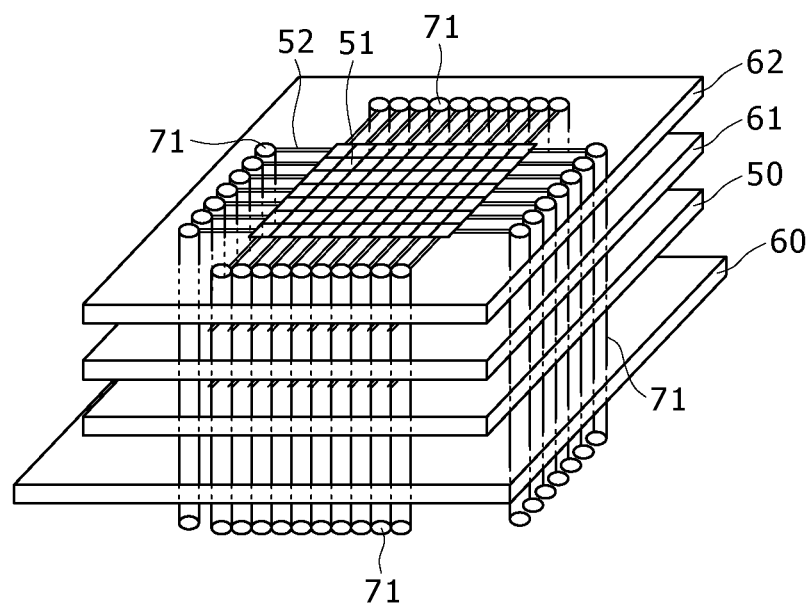
FIG. 18 is a perspective view showing a three-dimensional integrated circuit device according to a fifth example embodiment of this disclosure.

FIG. 18 shows a three-dimensional IC according to a fifth example embodiment.

As shown in FIG. 18, in this fifth example embodiment, the IC chips 50, 61, and 62 and the mounting substrate 60 are electrically connected to each other by through-interconnects 71 provided in such a manner as to penetrate each of the IC chips and the substrate, differently from the fourth example embodiment. In this case, the pad electrodes 53 are not provided on the IC chips 50, 61, and 62. Similarly, the pad electrodes 63 are not provided on the mounting substrate 60. The through-interconnects 71 play a role similar to that of these pad electrodes 53 and 63.

Concretely, the through-interconnect 71 can be formed in the following manner for example. In the IC chips 50, 61, and 62 and the mounting substrate 60, a via-hole penetrating them is formed. An insulating film such as a $SiO_2$ film is formed on the inner wall of this via-hole. Next, an electrically-conductive material such as Cu is buried in the inside of this via-hole. In this manner, the through-interconnect 71 is formed. The diameter of this via-hole is arbitrarily decided and is e.g. about 100 μm.

In this fifth example embodiment, the characteristics other than the above-described characteristic are the same as those of the fourth example embodiment.

According to this fifth example embodiment, the same advantages as those of the fourth example embodiment can be obtained.

<6. Sixth Example Embodiment>
[Three-Dimensional Integrated Circuit Device and Manufacturing Method Thereof]

Figure 19:
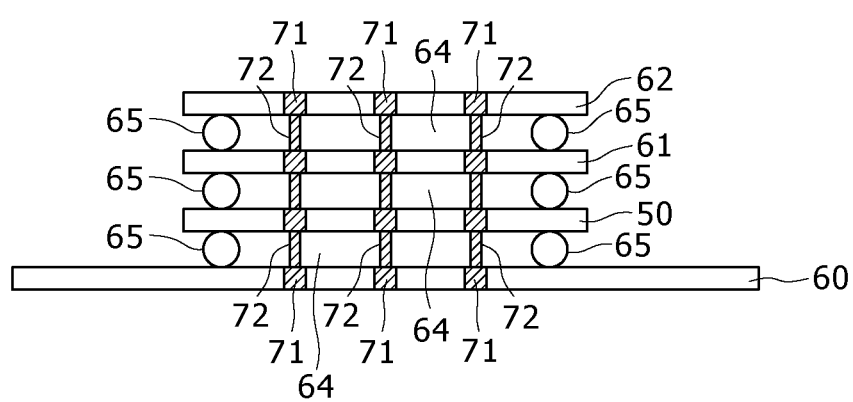
FIG. 19 is a sectional view showing a three-dimensional integrated circuit device according to a sixth example embodiment of this disclosure.

FIG. 19 shows a three-dimensional IC according to a sixth example embodiment.

As shown in FIG. 19, in this sixth example embodiment, the IC chips 50, 61, and 62 and the mounting substrate 60 are electrically connected to each other by molecular interconnects 72, differently from the first and second example embodiments. The molecular interconnect 72 is connected to the through-interconnects 71 provided in such a manner as to penetrate each of the IC chips 50, 61, and 62 and the mounting substrate 60. In this case, the pad electrodes 53 are not provided on the IC chips 50, 61, and 62. Similarly, the pad electrodes 63 are not provided on the mounting substrate 60. The through-interconnects 71 play a role similar to that of these pad electrodes 53 and 63.

As the molecular interconnect 72, a conventionally publicly-known molecular interconnect can be used. It can be formed by a conventionally publicly-known method (refer to e.g. Patent Document 2 and Non-Patent Document 1). The molecular interconnect 72 is not particularly limited but e.g. polypyrrole is used. Regarding the case of using polypyrrole as the molecular interconnect 72, a description about a method for forming this molecular interconnect 72 by electropolymerization is as follows.

First, similarly to the fifth example embodiment, the through-interconnects 71 are formed in the IC chips 50, 61, and 62, and the mounting substrate 60.

Next, similarly to the fourth example embodiment, the IC chips 50, 61, and 62 are sequentially stacked over the mounting substrate 60.

Next, an electrically-conductive plate (not shown) is provided on the upper surface of the uppermost IC chip 62 and is brought into electrical contact with the through-interconnects 71.

Next, the whole of the mounting substrate 60, the IC chips 50, 61, and 62 and the above-described electrically-conductive plate is immersed in an electrolytic solution. As the electrolytic solution, a pyrrole solution prepared by employing deoxygenated acetonitrile as the solvent is used. In this pyrrole solution, for example, the concentration is 0.05 to 0.1 mol/ml and the electrolyte concentration is 0.1 to 0.3 mol/ml. As the electrolyte, e.g. LiClO4, LiBF4, Et4NCl4, Et4NBF4, etc. is used.

A counter electrode is provided in the electrolytic solution. This counter electrode is used as a negative electrode and the above-described electrically-conductive plate is used as a positive electrode. A voltage of e.g. about 3.5 V is applied between both electrodes and electropolymerization is performed in the electrolytic solution. In this case, the pyrrole solution, which is a monomer solution, in the electrolytic solution is injected into each of the gaps 64 among the mounting substrate 60 and the IC chips 50, 61, and 62 by capillary action. Thereby, polypyrrole is formed by the electropolymerization of pyrrole between the through-interconnects 71 opposed to each other with the intermediary of the gaps 64 of the IC chips 50, 61, and 62 and the mounting substrate 60.

In this manner, the molecular interconnect 72 is formed. It is also possible to form an element such as a diode between the through-interconnects 71 by utilizing the behavior that the polypyrrole is generated from the positive electrode side, according to need.

In this sixth example embodiment, the characteristics other than the above-described characteristic are the same as those of the fourth example embodiment.

According to this sixth example embodiment, the same advantages as those of the fourth example embodiment can be obtained.

Embodiments of this disclosure are specifically described above. However, this disclosure is not limited to the above-described example embodiments and various kinds of modifications based on the technical idea of this disclosure are possible.

For example, numeric values, structures, configurations, shapes, materials, conditions, processes, and so forth cited in the above-described example embodiments are absolutely merely examples. According to need, numeric values, structures, configurations, shapes, materials, conditions, processes, and so forth different from them may be used.

Explanation of Reference Numerals

10 . . . Molecular element, 11 . . . Semiconductor substrate, 12 . . . Insulating film, 13 . . . Source electrode, 14 . . . Drain electrode, 15 . . . Gap, 16 . . . Functional molecule, 17, 18 . . . Gate electrode, 19 . . . Design pattern, 24 . . . Resist pattern, 25 . . . Electrode film, 31 . . . Main chain, 32 . . . Side chain, 50, 61, 62 . . . IC chip, 51 . . . Circuit part, 52 . . . Interconnect, 53 . . . Pad electrode, 60 . . . Mounting substrate, 63 . . . Electrode pad, 64 . . . Gap, 65 . . . Spacer, 66 . . . Wire, 71 . . . Through-interconnect, 72 . . . Molecular interconnect It should be understood that various changes and modifications to the presently preferred embodiments described herein will be apparent to those skilled in the art. Such changes and modifications can be made without departing from the spirit and scope of the present disclosure and without diminishing its intended advantages. It is therefore intended that such changes and modifications be covered by the appended claims.

The invention claimed is:

1. A molecular element comprising:
a functional molecule in which a side chain composed of a pendent molecule that has dielectric constant anisotropy and/or a dipole moment and in which orientation change occurs due to an electric field is covalently linked to a main chain composed of a conjugated molecule in which structural change occurs due to the orientation change of the pendent molecule and an electrical characteristic changes;
a source electrode and a drain electrode each having a corner part that are separated by a gap therebetween, the corner parts of the source electrode and the drain electrode being connected to one end and the other end, respectively, of the main chain of the functional molecule which is positioned in the gap; and
a gate electrode for applying an electric field for control to the pendent molecule;
wherein the molecular element is configured to function as a diode, a transistor, or a memory by an electric field applied to the pendent molecule.

2. The molecular element of claim 1, wherein distance between the source electrode and the drain electrode is equal to or shorter than 20 nm.

3. The molecular element of claim 2, wherein an electrically-conductive path is formed by the conjugated molecule and electrical conductivity of the electrically-conductive path is controlled by change in an electric field applied to the pendent molecule.

4. The molecular element of claim 3, wherein by change in an electric field applied to the pendent molecule, positional relationship between the pendent molecule and an electric field direction changes and an angle formed by the pendent molecule and the conjugated molecule changes.

5. The molecular element of claim 4, wherein the conjugated molecule has a fluorene skeleton.

6. The molecular element of claim 5, wherein the pendent molecule has a cyanobiphenyl skeleton.

7. An integrated circuit device comprising:
at least one molecular element having:
(a) a functional molecule in which a side chain composed of a pendent molecule that has dielectric constant anisotropy and/or a dipole moment and in which orientation change occurs due to an electric field is covalently linked to a main chain composed of a conjugated molecule in which structural change occurs due to the orientation change of the pendent molecule and an electrical characteristic changes;
(b) a source electrode and a drain electrode each having a corner part that are separated by a gap therebetween, the corner parts of the source electrode and the drain electrode being connected to one end and the other end, respectively, of the main chain of the functional molecule which is positioned in the gap;
(c) a gate electrode for applying an electric field for control to the pendent molecule; and
(d) wherein the molecular element is configured to function as a diode, a transistor, or a memory by an electric field applied to the pendent molecule.

8. A three-dimensional integrated circuit device obtained by disposing a plurality of substrates that are opposed to each other and include at least one substrate having at least one molecular element having: (a) a functional molecule in which a side chain composed of a pendent molecule that has dielectric constant anisotropy and/or a dipole moment and in which orientation change occurs due to an electric field is covalently linked to a main chain composed of a conjugated molecule in which structural change occurs due to the orientation change of the pendent molecule and an electrical characteristic changes; (b) a source electrode and a drain electrode each having a corner part that are separated by a gap therebetween, the corner parts of the source electrode and the drain electrode being connected to one end and the other end, respectively, of the main chain of the functional molecule which is positioned in the gap; (c) a gate electrode for applying an electric field for control to the pendent molecule; and (d) wherein the molecular element is configured to function as a diode, a transistor, or a memory by an electric field applied to the pendent molecule.

9. The molecular element of claim 1, wherein the gate electrode includes a pair of gate electrode portions that are provided opposed to each other in such a manner as to sandwich, from both sides, the functional molecule connected between the corner parts of the source electrode and the drain electrode.

10. The molecular element of claim 9, wherein the gate electrode is formed in the same layer as the source electrode and drain electrode.

11. The molecular element of claim 1, wherein an insulating layer is formed on the gate electrode, and the source electrode, drain electrode, and functional molecule are formed on the insulating layer.

* * * * *